(12) United States Patent
Liu

(10) Patent No.: US 12,413,153 B2
(45) Date of Patent: Sep. 9, 2025

(54) SWITCHING POWER SUPPLY USING TRANSFORMER FOR TRANSMITTING INFORMATION

(71) Applicant: MIX-DESIGN SEMICONDUCTOR TECHNOLOGIES LTD., Jiangsu (CN)

(72) Inventor: Wanle Liu, Jiangsu (CN)

(73) Assignee: MIX-DESIGN SEMICONDUCTOR TECHNOLOGIES LTD., Jiangsu (CN)

( * ) Notice: Subject to any disclaimer, the term of this patent is extended or adjusted under 35 U.S.C. 154(b) by 200 days.

(21) Appl. No.: 18/386,875

(22) Filed: Nov. 3, 2023

(65) Prior Publication Data

US 2024/0333165 A1    Oct. 3, 2024

(30) Foreign Application Priority Data

Apr. 1, 2023   (CN) .......................... 202310338981.X

(51) Int. Cl.
*H02M 3/335* (2006.01)
*H02M 1/00* (2006.01)
*H03M 1/66* (2006.01)

(52) U.S. Cl.
CPC ..... *H02M 3/33592* (2013.01); *H02M 1/0012* (2021.05); *H02M 1/0025* (2021.05); *H02M 3/33515* (2013.01); *H02M 3/33523* (2013.01); *H03M 1/66* (2013.01)

(58) Field of Classification Search
CPC ........... H02M 3/33592; H02M 1/0012; H02M 1/0025; H02M 1/08; H02M 3/33515; H02M 3/33523; H03M 1/66; Y02B 70/10
See application file for complete search history.

(56) References Cited

U.S. PATENT DOCUMENTS

| | | | | |
|---|---|---|---|---|
| 9,525,357 | B2 * | 12/2016 | Chen ................. | H02M 3/33553 |
| 9,991,812 | B2 * | 6/2018 | Chung .................... | H02M 3/24 |
| 10,116,222 | B2 * | 10/2018 | Cohen ............... | H02M 3/33592 |
| 2006/0083029 | A1 * | 4/2006 | Yoshida ............ | H02M 3/33592 |
| | | | | 363/6 |
| 2008/0025450 | A1 * | 1/2008 | Alfano ............. | H02M 3/33523 |
| | | | | 375/362 |
| 2011/0222318 | A1 * | 9/2011 | Uno .................. | H02M 3/33523 |
| | | | | 363/21.04 |
| 2013/0272035 | A1 * | 10/2013 | Strzalkowski .... | H02M 3/33546 |
| | | | | 363/21.01 |

(Continued)

*Primary Examiner* — Yusef A Ahmed
(74) *Attorney, Agent, or Firm* — Cooper Legal Group, LLC

(57) ABSTRACT

The present application discloses a switching power supply using a transformer for transmitting information. The switching power supply includes an encoding and controlling circuit configured for generating an encoded signal based on output information of the secondary side and demand information of an electrical equipment, and modulating the encoded signal onto a switch voltage waveform; a primary chip, configured to obtain the induced switch voltage waveform from the auxiliary winding; a decoding and controlling circuit configured for decoding the modulated switching voltage waveform; and a loop control and drive module configured to control on/off of the primary side switch tube according to decoded results to adjust the secondary side output information.

9 Claims, 7 Drawing Sheets

(56) References Cited

U.S. PATENT DOCUMENTS

| | | | | |
|---|---|---|---|---|
| 2014/0160810 A1* | 6/2014 | Zheng | H02M 3/33576 | |
| | | | 363/21.17 | |
| 2014/0268901 A1* | 9/2014 | Telefus | H02M 3/33576 | |
| | | | 363/21.01 | |
| 2015/0188442 A1* | 7/2015 | Kesterson | H02M 3/33523 | |
| | | | 363/21.15 | |
| 2016/0373011 A1* | 12/2016 | Kawashima | H02M 1/32 | |
| 2016/0373014 A1* | 12/2016 | Pflaum | H02M 3/33523 | |
| 2017/0070156 A1* | 3/2017 | Chapman | H02M 1/14 | |
| 2017/0338746 A1* | 11/2017 | Chen | H02M 3/33592 | |
| 2018/0054128 A1* | 2/2018 | Li | H02M 3/33507 | |
| 2018/0205319 A1* | 7/2018 | Zhuo | H02M 3/33523 | |
| 2018/0248490 A1* | 8/2018 | Lin | H02M 3/28 | |
| 2019/0089264 A1* | 3/2019 | Hirose | H02M 3/285 | |
| 2019/0252985 A1* | 8/2019 | Radic | H02M 3/33515 | |
| 2019/0356231 A1* | 11/2019 | Radic | H02M 3/33523 | |
| 2021/0111630 A1* | 4/2021 | Zhao | H02M 1/36 | |
| 2021/0257922 A1* | 8/2021 | Bessegato | H02M 3/33523 | |
| 2021/0408926 A1* | 12/2021 | Feng | H02M 1/08 | |
| 2024/0333122 A1* | 10/2024 | Liu | H02M 3/33523 | |
| 2024/0421688 A1* | 12/2024 | Shen | H02M 1/0058 | |
| 2025/0007412 A1* | 1/2025 | Shen | H02M 1/44 | |

\* cited by examiner

Encoding and controlling circuit (1), configured for obtaining output information of a secondary side of the switching power supply and demand information of an electrical equipment, and generating an encoded signal according to the output information and the demand information, wherein the encoded signal comprises a data bit and a sampling bit

↓

Decoding and controlling circuit (1), further configured for controlling on/off of a synchronous rectification MOS transistor Q1, and modulating the encoded signal onto a switch voltage waveform of a transformer secondary winding by using a switch voltage waveform as a carrier

↓

Transformer auxiliary winding obtains modulated switching voltage waveform of the transformer secondary winding by coupling

↓

Sampling module (21) is configured to sample the modulated switch voltage waveform and generate a sampling signal

↓

Judging and decoding module (22) is configured to decode the sampling signal to generate a decoded signal, output a digital signal corresponding to the data bit in the decoded signal to the DAC module, and output an analog feedback signal corresponding to the sampling bit in the decoded signal to the loop control and drive module

↓

DAC module (23) is configured to convert the digital signal corresponding to the data bit into an analog signal, and output the analog signal to the loop control and drive module (24)

↓

Loop control and driver module (24) is configured to control on/off time of a primary switch Q2 based on the analog feedback signal corresponding to the sampling bit output by the judging and decoding module or the analog signal output by the DAC module, in order to adjust output information of the secondary side of the switching power supply and adapt the output information of the secondary side of the switching power supply to the demand information of the electrical equipment

FIG. 1

SWITCHING POWER SUPPLY USING TRANSFORMER FOR TRANSMITTING INFORMATION

CROSS-REFERENCE TO RELATED APPLICATION

The present application is based on and claims the priority benefits of China application No. 202310338981.X, filed on Apr. 1, 2023. The entirety of China application No. 202310338981.X is hereby incorporated by reference herein and made a part of this specification.

TECHNICAL FIELD

The present application relates to the field of electronic circuit technology, and, in particular, to a switching power supply that uses a transformer to transmit information.

BACKGROUND

For designing a switching power supply, secondary side feedback (SSR) control and primary side feedback (PSR) control methods are usually adopted. The secondary feedback of a switching power supply refers to a process in which detection of output information is conducted on the secondary side of a transformer, and then the output information is transmitted to the primary side of the transformer through a feedback circuit composed of an optocoupler, an error amplifier, and related resistive and capacitive components. However, this implementation method has the following drawbacks: on one hand, the presence of a detector, an amplifier, and an isolation feedback device increases the complexity of the switching power supply, as well as the volume of the product. On the other hand, the optocoupler cannot continue to work at high temperatures since it is prone to aging, thereby reducing the service life of the switching power supply.

The primary feedback of the switching power supply refers to a process in which the output information of the secondary side is obtained from the auxiliary winding on the primary side of the transformer. Since the voltage at the auxiliary winding on the primary side and the secondary winding on the secondary side is determined by the ratio of turns of a transformer, the output information of the secondary side can be obtained by sampling the feedback information of the auxiliary winding on the primary side.

Compared with the secondary feedback, the primary feedback method eliminates components such as an optocoupler and an error amplifiers, reduces the complexity of the overall circuit, and also reduces costs. Therefore, the primary feedback control method has broad application prospects in markets having high cost pressure such as a mobile phone charger and LED drives subjected to high volume requirements. However, due to the fact that the primary feedback adopts sampling and controlling on the primary side of a transformer, operation of various components in a system will produce more interference, resulting in lower sampling and control accuracy.

In order to solve the problem of low accuracy in information sampling and controlling in the primary feedback control method, there are a variety of transmission methods in the market that transfer information from the secondary side of a transformer to the primary side thereof. However, these transmission methods can easily affect the stability of a system in operation, reduce the reliability of information transmission, and even cause the system to fail to operate normally.

In view of the many problems mentioned above in existing technology, there is an active demand in the art to find a new, complete and reliable switching power supply that transmits information through a transformer based on current researches.

SUMMARY

In order to solve the problem that transmitting information from a secondary side of a transformer to a primary side thereof can easily affect the stable operation of a system and cause abnormal operation of the system and low reliability of information transmission, the present application provides a complete and reliable switching power supply using a transformer for transmitting information.

The present application provides a switching power supply using a transformer for transmitting information, including:

an encoding and controlling circuit, configured for obtaining output information from a secondary side of the switching power supply and demand information from an electrical equipment, and generating an encoded signal according to the output information and the demand information, wherein the encoded signal comprises a data bit and a sampling bit; and configured for controlling on/off of a synchronous rectification MOS transistor Q1, and modulating the encoded signal onto a switch voltage waveform of a transformer secondary winding by using a switch voltage waveform as a carrier;

a transformer auxiliary winding, configured to obtain modulated switching voltage waveform of the transformer secondary winding by coupling; and a decoding and controlling circuit, configured for sampling and decoding the modulated switching voltage waveform, wherein the decoding and controlling circuit comprises a sampling module, a judging and decoding module, a DAC module, and a loop control and drive module, wherein, the sampling module is configured to sample the modulated switching voltage waveform and generate a sampling signal;

the judging and decoding module is configured to decode the sampling signal to generate a decoded signal, output a digital signal corresponding to the data bit in the decoded signal to the DAC module, and output an analog feedback signal corresponding to the sampling bit in the decoded signal to the loop control and drive module;

the DAC module is configured to convert the digital signal corresponding to the data bit into an analog signal, and output the analog signal to the loop control and drive module; and the loop control and drive module is configured to control on/off time of a primary switch Q2 based on the analog feedback signal corresponding to the sampling bit output by the judging and decoding module or the analog signal output by the DAC module, in order to adjust output information of the secondary side of the switching power supply and adapt the output information of the secondary side of the switching power supply to the demand information of the electrical equipment.

In the above technical solution, by sampling and encoding on the secondary side of the switching power supply and decoding and controlling on the primary side of the switching power supply, it can ensure reliable information transmission and avoid affecting the stable operation of the system.

BRIEF DESCRIPTION OF THE DRAWINGS

FIG. 1 is a flowchart of a method for transmitting information through a transformer according to a specific embodiment of the present application;

DETAILED DESCRIPTION

In order to clearly illustrate the purpose, technical solutions, and advantages of the present application, the present application will be further explained in details in conjunction with FIGS. 1-7.

Figure 2:
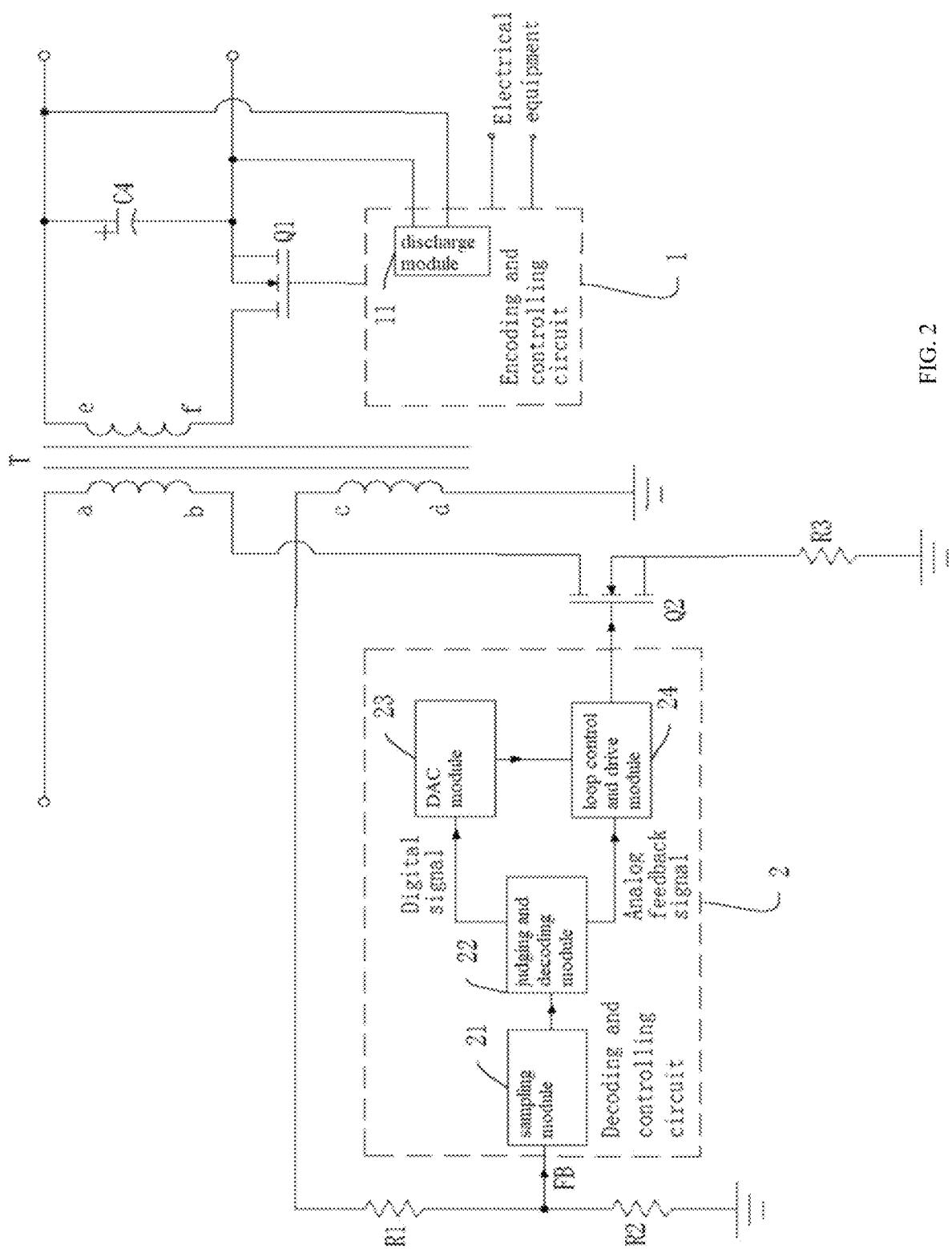
FIG. 2 is a schematic diagram of an overall circuit structure of a switching power supply system according to a specific embodiment of the present application.

In an embodiment of the present application embodiment a switching power supply that transmits information through a transformer is disclosed, as shown in FIG. 2. The switching power supply includes a transformer, an encoding and controlling circuit 1, a decoding and controlling circuit 2, a synchronous rectification MOS transistor Q1, a primary side switch transistor Q2, a resistor R1, a resistor R2, a resistor R3, and a polar capacitor C4. The ports a and b of the transformer are primary windings, which are connected to the power supply. A drain of the primary switch tube Q2 is connected to the port b of the transformer, and a source of the primary switch tube Q2 is connected in series with the resistor R3 and then grounded. Ports c and port d of the transformer are primary auxiliary windings. The port c of the transformer is connected in series with the resistance R1 and R2, and then grounded. The port d of the transformer is grounded. Ports e and f of the transformer are secondary windings, and the switching power supply supplies power to an electrical equipment through the ports e and f of the transformer. A drain of the synchronous rectification MOS transistor Q1 is connected to the port f of the transformer, a source of the synchronous rectification MOS transistor Q1 is connected to the electrical equipment, a positive electrode of the polar capacitor C4 is connected to the port e, and a negative electrode of the polar capacitor C4 is connected to the port f. The polar capacitor C4 is used to filter a voltage output to the electrical equipment, so that the voltage output to the electrical equipment is more stable. The primary winding and auxiliary winding of the transformer are located on the primary side of the switching power supply system, while the secondary winding of the transformer is located at the secondary side of the switching power supply system.

As shown in FIG. 2, the decoding and controlling circuit 2 includes a sampling module 21, a judging and decoding module 22, a DAC module 23, and a loop control and drive module 24. The specific connection relationships of each module are as follows:

An input end of sampling module 21 is connected to an ungrounded end of resistor R2, an output end of sampling module 21 is connected to an input end of a judging and decoding module 22, an output end of judging and decoding module 22 is respectively connected to input ends of the DAC module 23 and a loop control and drive module 24, an output end of DAC module 23 is connected to the loop control and drive module 24, and an output end of loop control and drive module 24 is connected to a gate of the primary switch tube Q2.

A process of transmitting information through a transformer in the switching power supply in the embodiment of the present application is as follows:

step S101: the encoding and controlling circuit 1 is located at the secondary side of the switching power supply, and is connected to the secondary winding of the transformer to obtain output information on the secondary side of the switching power supply. The encoding and controlling circuit 1 is further connected to the electrical equipment to obtain a demand information of the electrical equipment. The encoding and controlling circuit 1 generates an encoded signal based on the output information and the demand information, in which the encoded signal includes data bits and sampling bits. The encoded signal generated by the encoding and controlling circuit 1 based on the output information and the demand information can be a difference between the output information and the demand information.

Specifically, the output information at the secondary side of the switching power supply mentioned above includes one or more selected from a group consisting of an output voltage, an output current, an output power, and output line loss compensation information. The demand information of the electrical equipment mentioned above includes one or more selected from a group consisting of a demand voltage, a demand current, a demand power, and a demand line loss compensation information.

Figure 6:
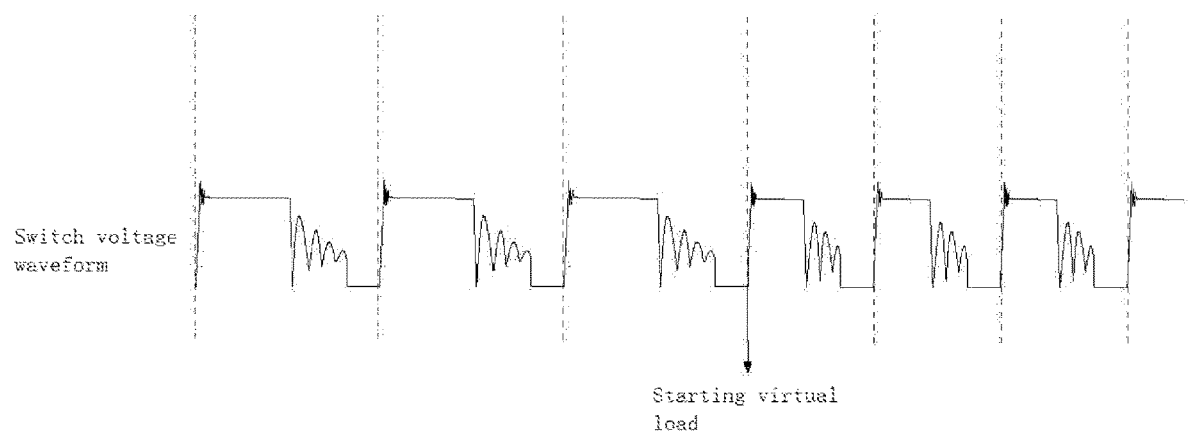
FIG. 6 is a schematic diagram of the changes in the switch voltage waveform of the switching power supply system before and after starting the virtual load in DCM mode according to a specific embodiment of the present application.

Further, the encoding and controlling circuit 1 further includes a discharge module 11, which is a controllable virtual load. The discharge module 11 is connected to the secondary winding of the transformer. The discharge module 11 is used to increase switching frequency of the system when the frequency of the switch voltage waveform of the secondary winding is low due to light or no-load operation of the system, so as to improve information transmission speed or efficiency. As shown in FIG. 6, after starting the virtual load, the switching frequency of the system increases and the cycle time decreases.

The data bits and sampling bits in the encoded signal are alternately arranged. One or more data bits can be arranged between adjacent sampling bits, and one or more sampling bits can also be arranged between adjacent data bits. The data bits are used to represent output information and demand information, and the sampling bits are used to ensure that the sampling function of the system for the output voltage during a normal working cycle is not affected, so that data transmission does not affect the normal and stable operation of the system.

step S102: the encoding and controlling circuit 1 is connected to a gate of the synchronous rectification MOS transistor Q1. The encoding and controlling circuit 1 controls the orderly on/off of the synchronous rectification MOS transistor Q1, and a voltage difference is generated between the on and off states of the controlled synchronous rectification MOS transistor Q1. The switch voltage waveform is used as a carrier to modulate the encoded signal onto the switch voltage waveform of the transformer secondary winding.

In particular, the encoding and controlling circuit 1 modulates the encoded signal onto the switch voltage waveform of the secondary winding in the following ways: the encoding and controlling circuit 1 can modulate one or more data bits of the encoded signal onto one signal cycle of the switch voltage waveform of the secondary winding, or modulate one data bit of the encoded signal onto two or more signal cycles of the switch voltage waveform of the secondary winding. When the frequency of the secondary winding switch voltage waveform is low, modulating multi data bits of the encoded signal to one signal cycle of the secondary winding switch voltage waveform can effectively improve the efficiency of information transmission. However, to ensure reliable information transmission, generally, the modulated data in one signal cycle does not exceed 2 bits.

Modulating one data bit of the encoded signal data to one signal cycle of the secondary winding switch voltage waveform by the encoding and controlling circuit 1 can be achieved by the following manners: the encoding and controlling circuit 1 turns on the synchronous rectification MOS transistor Q1 in a first 1/n cycle of a high level period within one signal cycle of the secondary winding switch voltage waveform and turns off the synchronous rectification MOS transistor Q1 in a last (n−1)/n cycle of the high level period within one signal cycle of the secondary winding switch voltage waveform, and modulate one data bit of the encoded signal to one signal cycle of the secondary winding switch voltage waveform; and, alternatively, the encoding and controlling circuit 1 turn off the synchronous rectification MOS transistor Q1 in a first 1/n cycle during the high level period of the secondary winding switch voltage waveform within one signal cycle, turns on the synchronous rectification MOS transistor Q1 in the last (n−1)/n cycle during the high level period of the secondary winding switch voltage waveform within one signal cycle, and modulates one bit of data in the encoded signal to one signal cycle of the secondary winding switch voltage waveform, where n is a natural number greater than 1.

step S103: the transformer auxiliary winding obtains modulated switching voltage waveform of the transformer secondary winding through coupling.

The following are the steps of sampling and decoding the modulated switching voltage waveform by the decoding and controlling circuit 2, and the sampling and decoding process includes:

step S104: the sampling module 21 generates a sampling signal by sampling the modulated switching voltage waveform.

step S105: the judging and decoding module 22 decodes the sampled signal to generate a decoded signal, which includes two signals, one of which is a digital signal corresponding to decoded data bit, and is output by the judging and decoding module 22 to the DAC module 23, and the other of which is an analog feedback signal corresponding to sampling bit, and is output by the judging and decoding module 22 to the loop control and drive module 24.

In particular, a complete encoded signal is composed of header data $D_{start}$ or trigger bit $D_{trigger}$, as well as preset sampling and data bits thereafter. If it is judged that there is no header data $D_{start}$ or trigger bit $D_{trigger}$ in the decoded signal generated by the judging and decoding module 22, it is considered as invalid data bits, and the judging and decoding module 22 does not output the digital signal corresponding to the data bits to the DAC module 23. If it is judged that there is a header data $D_{start}$ or trigger bit $D_{trigger}$ in the decoded signal generated by the judging and decoding module 22, it is considered as a valid data bit, and the judging and decoding module 22 will output the digital signal corresponding to the data bit starting from the last bit or multiple bits of the header data $D_{start}$ or trigger bit $D_{trigger}$ to the DAC module 23. For example, if the header data in the encoded signal is "00", the judging and decoding module 22 decodes the header data "00" and outputs the digital signal corresponding to the data bit from one or more bits after the header data "00" to the DAC module 23, and the DAC module 23 converts the digital signal into an analog signal and outputs it to the loop control and drive module 24, causing the loop control and drive module 24 to adjust the output information on the secondary side, for example, the output voltage and the output current. Using the header data $D_{start}$ or trigger bit $D_{trigger}$ as a trigger point for outputting the decoded signal greatly improves the reliability of decoding and prevents the decoding process from being disturbed by system signals or causing malfunctions.

Specifically, the design of the header data $D_{start}$ or trigger bit $D_{trigger}$ needs to ensure a different interval from that in normally transmitted data bits and sampling bits, in order to distinguish uniqueness and ensure the decoding of correct and reliable digital information. For example, when the sampling bit is always defined as "1" and only one data bit is passed between adjacent sampling bits, a combination of adjacent sampling bits and data bits that can be obtained is only "10" and "11". Therefore, the combination of adjacent sampling bits and data bits cannot be "00", and "00" can be used as the unique header data $D_{start}$ or trigger bit $D_{trigger}$. On the contrary, when the sampling bit is always defined as "0" and only one data bit is passed between adjacent sampling bits, the combination of adjacent sampling bits and data bits that can be obtained can only be "01" and "00". Therefore, the combination of adjacent sampling bits and data bits that can be obtained cannot be "11". Therefore, "11" can be used as the unique header data $D_{start}$ or trigger bit $D_{trigger}$. For another example, when the sampling bit is always defined as "1" and 2 data bits are passed between adjacent sampling bits, the combination of adjacent sampling bits and data bits that can be obtained can only be: "100", "111", "101", "110", and there will be no "000" in the combination, so "000" can be used as the unique header data $D_{start}$ or trigger bit $D_{trigger}$. Likewise, it can be obtained that the number of bits in the header data $D_{start}$ or trigger bit $D_{trigger}$ is always at least 1 bit more than the number of bits passed between adjacent sampling bits. For example, if the number of bits passed between adjacent sampling bits is 2, then the number of bits in the header data $D_{start}$ or trigger bit $D_{trigger}$ needs to be at least 3 bits. However, because the $D_{start}$ or trigger bit $D_{trigger}$ of the header data cannot be set as the sampling bit, if the number of bits set for the $D_{start}$ or trigger bit $D_{trigger}$ of the header data is too long, it will prolong the sampling interval of the system, thereby affecting the dynamic response characteristics of the system.

Based on the above considerations, it is recommended that the $D_{start}$ or trigger bit $D_{trigger}$ of the header data should generally not exceed 3 bits.

step S106: the loop control and drive module 24 obtains the output information of the secondary side of the switching power supply based on the analog feedback signal corresponding to the sampling bit output by the judging and decoding module 22, the loop control and drive module 24 compares the obtained output information of the secondary side with a preset reference value to obtain a difference between the output information and the preset reference value, and the loop control and drive module 24 controls the on/off time of the primary switch Q2 based on the difference between the output information and the preset reference value, thereby quickly adjusting the output state of the secondary side to adapt to the demand information value of the electrical equipment corresponding to the preset reference value.

Specifically, the preset reference value mentioned above is the demand information value of an electrical equipment connected to the secondary side. For example, when adjusting the output voltage, the preset reference value is equal to the demand voltage value of the electrical equipment connected to the secondary side.

step S107: DAC module 23 converts the digital signal corresponding to the data bits output by the judging and decoding module 22 into an analog signal, and outputs the analog signal to the loop control and drive module 24, the loop control and drive module 24 updates the preset reference value based on the analog signal, and controls the on/off time of the primary switch Q2 based on the updated reference value, so as to adjust the output information of the secondary side.

Therefore, by setting sampling bits having fixed intervals, the loop control and drive module 24 can timely sense the output status of the secondary side and quickly perform system adjustments to maintain stable output of the system, eliminate the impact of modulation signals on the switch voltage waveform on the system sampling function, ensure normal and stable operation of the system, and improve system reliability.

There are two adjustment methods for steps S106 and S107 mentioned above. One is to obtain the output information of the secondary side of the switching power supply through the analog feedback signal corresponding to the sampling bit, then compare it with the preset reference value, and adjust the output information of the secondary side accordingly based on the comparison results. The other one is to obtain a difference between an output information and a demand information by decoding, update the preset reference value based on the difference between the output information and the demand information, and control and adjust the output information of the secondary side based on the updated reference value. By combining these two adjustment methods, the adjustment accuracy of the secondary side output information in the switching power supply system is greatly improved, which, in turn, improves the matching between the output information of the secondary side and the demand information of the electrical equipment.

In previous efforts, it has been often found that the information transmission process seriously interferes with the system's operation, causing it to be unstable or even unable to work, and even has fatal drawbacks such as unreliable information transmission. In view of this, the present application adopts a new secondary side sampling encoding and primary side decoding control method to provide a complete and reliable information transmission and reception method, overcoming some of the shortcomings present in previous research methods. By sampling and encoding at the secondary side of the switching power supply and decoding and controlling at the primary side of the switching power supply, reliable information transmission can be ensured while avoiding affecting the stable operation of the system.

Figure 3:
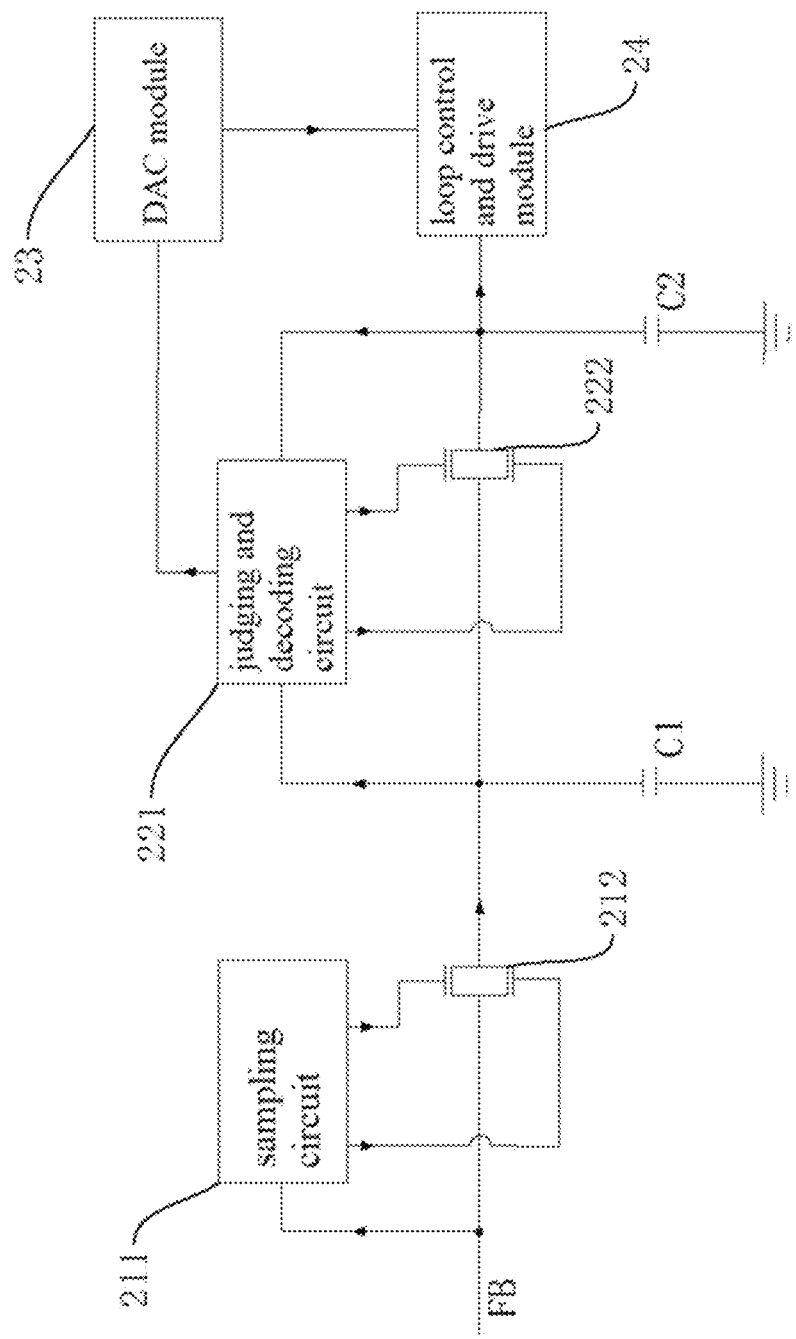
FIG. 3 is a schematic circuit diagram of a decoding and controlling circuit 2 according to a specific embodiment of the present application.

As shown in FIG. 3, it is one of the implementation methods of the sampling module 21 and the judging and decoding module 22 in the present application: the sampling module 21 includes a sampling circuit 211 and a first transmission gate 212, and the judging and decoding module 22 includes a judging and decoding circuit 221, a first capacitor C1, a second transmission gate 222, and a second capacitor C2.

Among them, the first transmission gate 212 and the second transmission gate 222 can also be replaced by other components with switching functions.

Further, the encoding and controlling circuit 1 in this embodiment can also use ADC to collect the difference between the output information of the secondary side and the demand information of the electrical equipment, and transmit this difference to the decoding and controlling circuit 2, so that the sampling circuit 211 controls the on/off of the first transmission gate 212 and the judging and decoding circuit 221 controls the on/off of the second transmission gate 222.

The following is a specific explanation of the connection methods between the sampling module 21 and the judging and decoding module 22, based on FIG. 3:

The ungrounded end of the resistor R2 is simultaneously connected to the sampling circuit 211 and the first transmission gate 212, the sampling circuit 211 is connected to a control end of the first transmission gate 212, and the sampling circuit 211 is configured to control the on/off of the first transmission gate 212 at an appropriate time and transmit the sampling signal.

The output end of the first transmission gate 212 is simultaneously connected to one end of the first capacitor C1, the judging and decoding circuit 221, and an input end of the second transmission gate 222, a second end of the first capacitor C1 is grounded, and the judging and decoding circuit 221 is further connected to the DAC module 23. The judging and decoding circuit 221 is further connected to a control end of the second transmission gate 222. An output end of the second transmission gate 222 is simultaneously connected to the loop control and drive module 24, one end of the second capacitor C2, and the judging and decoding circuit 221. The other end of the second capacitor C2 is grounded, and the voltage value $V_{c\text{-}hold}$ on the second capacitor C2 is an initial preset value. The judging and decoding circuit 221 is configured to control the on/off of the second transmission gate 222 to prevent incorrect sampling voltage from being transmitted to the second capacitor C2.

DAC module 23 is connected to loop control and drive module 24.

Figure 4:
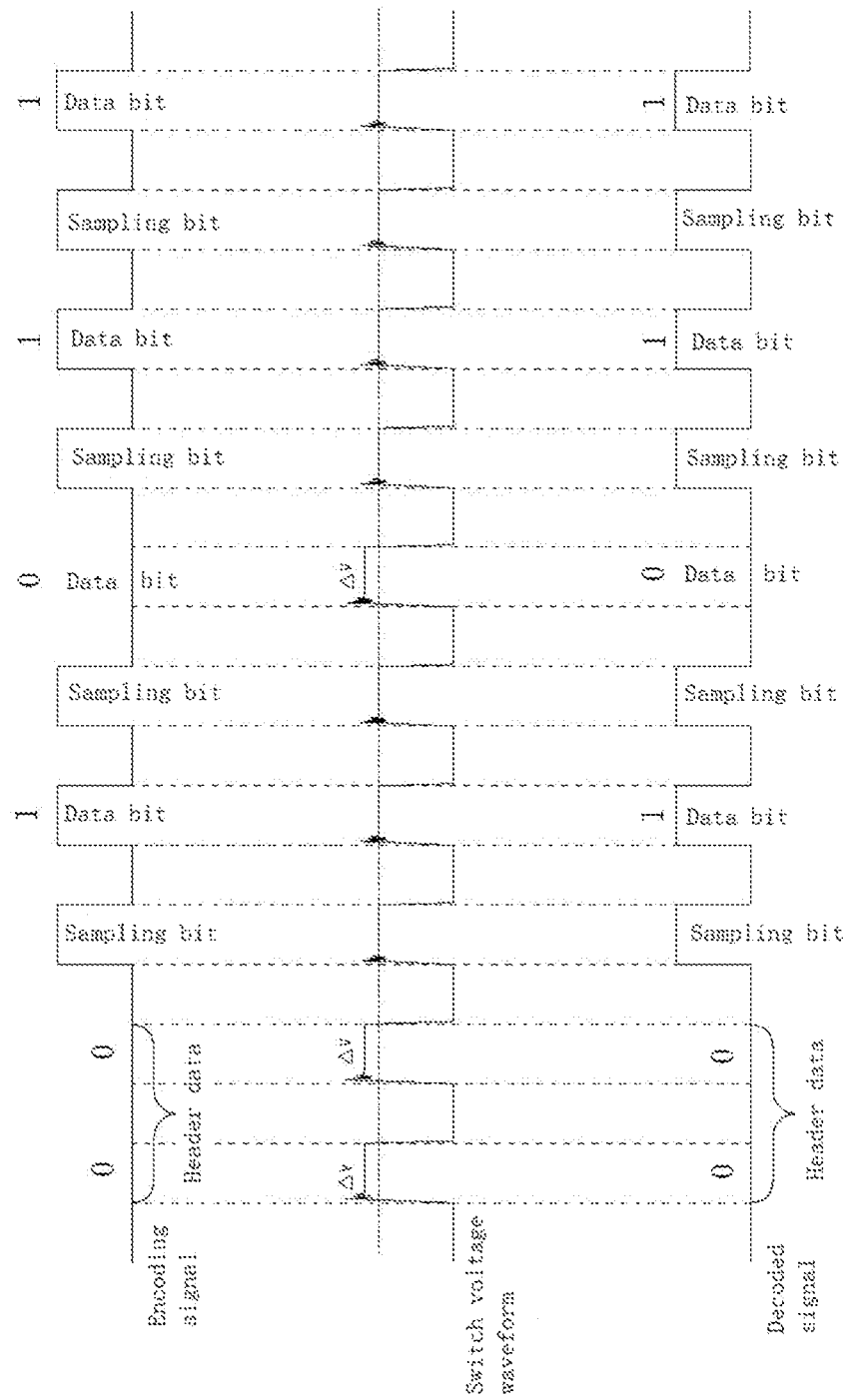
FIG. 4 is a schematic diagram of encoded signal, switch voltage waveform, and decoded signal of a switching power supply system in CCM mode according to a specific embodiment of the present application.

Referring to FIG. 4, a schematic diagram of the encoded signal, the switch voltage waveform, and the decoded signal of the switching power supply system operating in CCM mode is shown. The following is a specific explanation of a process of transmitting information through a transformer in an embodiment of the present application, combined with FIGS. 2, 3, and 4. The initial voltage value $V_{c\text{-}hold}$ on the second capacitor C2 is preset as V1.

If the output voltage at the secondary side of the switching power supply is 4.8V, the demand voltage of the electrical equipment is 5V, and a preset voltage reference value in the loop control and drive module 24 is 5V, the encoding and controlling circuit 1 obtains a difference value of 0.2V based on the output voltage of 4.8V on the secondary side and the demand voltage 5V of the electrical equipment. Then the encoding and controlling circuit 1 quantifies and encodes the difference value of 0.2V to obtain the encoded data "1011" corresponding to 0.2V, where the first and second digits "10" in the encoded data "1011" represent an increase, and the third and fourth digits "11" in the encoded data "1011" represent 0.2V. The encoding and controlling circuit 1 generates a corresponding encoded signal based on this encoded data, with the sampling bit set to "1" in the encoded signal. The encoding and controlling circuit 1 modulates only one bit of data in one signal cycle of the switch voltage waveform, sets one sampling bit "1" between adjacent data bits, and sets the header data $D_{start}$ to "00".

Specifically, due to the setting of one sampling bit "1" between adjacent data bits, it can be seen from the above that, the combination of adjacent sampling bits and data bits can only be "10" and "11", and cannot be "00". Therefore, the header data $D_{start}$ is set to "00".

The encoded signal is shown in FIG. 4, where the first two bits "00" are the set header data $D_{start}$, the data "1011" on the fourth, sixth, eighth, and tenth bits are the voltage signal to be transmitted, and the third, fifth, seventh, and ninth bits are all sampling bits.

By controlling the on/off of synchronous rectification MOS transistor Q1 by encoding and controlling circuit 1, when transmitting data "1", the encoding and controlling circuit 1 turns off the synchronous rectification MOS transistor Q1, so that the sampling circuit samples and obtains a voltage of V1, that is, the input voltage of the first transmission gate 212 is V1. When transmitting data "0", the encoding and controlling circuit 1 turns on the synchronous rectification MOS transistor Q1, so that the sampling circuit samples obtains a voltage of V1+ΔV, that is, the input voltage of the first transmission gate 212 is V1+ΔV. The switch voltage waveform of the input end of the first transmission gate 212 is shown in FIG. 4. The decoding process is explained in detail below.

step S201: when transferring the first bit "O" in the header data $D_{start}$ "00", the input voltage of the first transmission gate 212 is V1+ΔV. The sampling circuit 211 turns on the first transmission gate 212, and the first transmission gate 212 transfers the voltage value V1+ΔV to the first capacitor C1, so that the voltage value on the first capacitor C1 is also V1+ΔV. If the judging and decoding circuit 221 compares the voltage value V1+ΔV on the first capacitor C1 with the initial voltage value V1 on the second capacitor C2 and determines that there is a voltage difference ΔV therebetween, the judging and decoding circuit 221 decodes to obtain "0", and turns off the second transmission gate 222.

step S202: when transmitting the second bit "0" in the header data $D_{start}$ "00", the decoding process follows the description in step S201. The judging and decoding circuit 221 decodes to obtain "0", and the judging and decoding circuit 221 turns off the second transmission gate 222.

Through the above steps S201-S202, when the decoding circuit 221 has obtained the header data "00" by decoding, the decoding circuit 221 determines the decoded signal obtained from the next bit, outputs the digital signal corresponding to the data bit in the decoded signal to the DAC module 23, and outputs the analog feedback signal corresponding to the sampling bit in the decoded signal to the loop control and drive module 24.

step S203: When transmitting the sampling bit data "1" in the encoded signal, the input voltage of the first transmission gate 212 is V1, the sampling circuit 211 turns on the first transmission gate 212, and the first transmission gate 212 transfers the voltage value V1 to the first capacitor C1, so that the voltage value on the first capacitor C1 is also V1. If the judging and decoding circuit 221 compares the voltage value V1 on the first capacitor C1 with the voltage value V1 on the second capacitor C2, and determines that there is no voltage difference therebetween, it performs decoding to obtain the sampling bit "1". The judging and decoding circuit 221 turns on the second transmission gate 222, and outputs the analog feedback signal corresponding to the sampling bit "1" to the loop control and drive module 24. Here the analog feedback signal is the output voltage on the secondary side of the switching power supply indirectly obtained by coupling the auxiliary winding. The analog feedback signal is transmitted to the loop control and drive module 24, so that the latter can obtain the output voltage on the secondary side of the switching power supply obtained by coupling the auxiliary winding.

step S204: when transmitting the first bit of data "1" in the encoded data "1011", which is a data on the data bit, the decoding process is as described in step S203, by which the judging and decoding circuit 221 decodes to obtain "1", stores the decoded data "1", and turns on the second transmission gate 222. Of course, the judging and decoding circuit 221 can also be set to turns off the second transmission gate 222.

However, it is recommended to set the judging and decoding circuit 221 to turn on the second transmission gate 222 when transmitting data "1", and transmit the analog feedback signal corresponding to data "1" to the loop control and drive module 24, which can effectively improve the response speed of the system. At the same time, turning on the second transmission gate 222 can also update the voltage value on the second capacitor C2, avoiding a decrease in the voltage value on the second capacitor C2 caused by the natural discharge of the second capacitor C2, thereby affecting the decoding result of the judging and decoding circuit 221.

Further, due to the natural discharge of the second capacitor C2, when the judging and decoding circuit 221 compares the voltage value on the first capacitor C1 with the voltage value on the second capacitor C2, it can also be set that, if the voltage difference ΔV between the voltage value on the first capacitor C1 and the voltage value on the second capacitor C2 is less than a preset threshold voltage, the judging and decoding circuit 221 judges that the voltage value on the first capacitor C1 is the same as the voltage value on the second capacitor C2 at this time, and decodes obtained data to "1".

step S205: when transmitting the sampling bit data "1" in the encoded signal, the decoding process is described in step S203, in which the judging and decoding circuit 221 decodes to obtain the sampling bit "1", and turns on the second transmission gate 222 to update the voltage value on the second capacitor C2. At the same time, the loop control and drive module 24 receives the analog feedback signal corresponding to the sampling bit transmitted by the second transmission gate 222.

step S206: when transmit the second bit of data "0" in the encoded data "1011", which is a data on the data bit, the decoding process is described in step S201, by which the judging and decoding circuit 221 obtains "0", stores the decoded data "0", and turns off the second transmission gate 222.

step S207: when transmitting the sampling bit data "1" in the encoded signal, the decoding process is described in step S203, by which the judging and decoding circuit 221 decodes to obtain "1", and turns on the conduction of the second transmission gate 222 to update the voltage value on the second capacitor C2. At the same time, the loop control and drive module 24 receives the analog feedback signal corresponding to the sampling bit transmitted by the second transmission gate 222.

step S208: when transmitting the third bit of data "1" in the encoded data "1011", which is a data on the data bit, the decoding process is described in step S203, by which the judging and decoding circuit 221 decodes to obtain "1", stores the decoded data "1", and turns on the second transmission gate 222. Of course, the judging and decoding circuit 221 can also be set to turns off the second transmission gate 222.

step S209: when transmitting the sampling bit data "1" in the encoded signal, the decoding process is described in step S203, by which the judging and decoding circuit 221 decodes to obtain "1", and turns on the second transmission gate 222 to update the voltage value on the second capacitor C2. At the same time, the loop control and drive module 24 receives the analog feedback signal corresponding to the sampling bit transmitted by the second transmission gate 222.

step S210: when transmitting the fourth bit of data "1" in the encoded data "1011", which is a data on the data bit, the decoding process is described in step S203, by which the judging and decoding circuit 221 decodes to obtain the data "1", stores the decoded data "1", and turns on the second transmission gate 222. Of course, the judging and decoding circuit 221 can also be set to turns off the second transmission gate 222.

In the above steps S201 to S210, the loop control and drive module 24 receives the analog feedback signal corresponding to the sampling bit transmitted by the second transmission gate 222, compares the output voltage of the secondary side corresponding to the analog feedback signal with the preset voltage reference value to obtain the difference therebetween, controls the on/off time of the primary side switch Q2 based on this difference, and quickly adjusts the output voltage of the secondary side of the switching power supply, so that the output voltage of the secondary side reach the preset voltage reference value, that is, 5V. By transmitting the analog feedback signal corresponding to the sampling bit to the loop control and drive module 24, the loop control and drive module 24 can timely sense the output voltage state of the secondary side and quickly perform system adjustments to maintain a stable output voltage state of the system, eliminate the impact of modulation signals on the switch voltage waveform on the system sampling function, ensure the normal and stable operation of the system, and improve the reliability of the system.

Through the above steps S201-S210, the judging and decoding circuit 221 has decoded to obtain the digital signal "1011" corresponding to the data bit and output the digital signal "1011" corresponding to this data bit to the DAC module 23. The DAC module 23 converts the received digital signal into a corresponding analog signal, and outputs the analog signal to loop control and drive module 24 to update the preset voltage reference value of 5V and increase the voltage reference value. Based on the updated reference value, loop control and drive module 24 can determine that the output voltage on the secondary side is too low and needs to increase the output voltage on the secondary side. Therefore, the loop control and drive module 24 controls the on/off time of the primary switch Q2, adjusts the output voltage of the secondary side of the switching power supply, and increases the output voltage to 5V of the required voltage of the electrical equipment.

Figure 5:
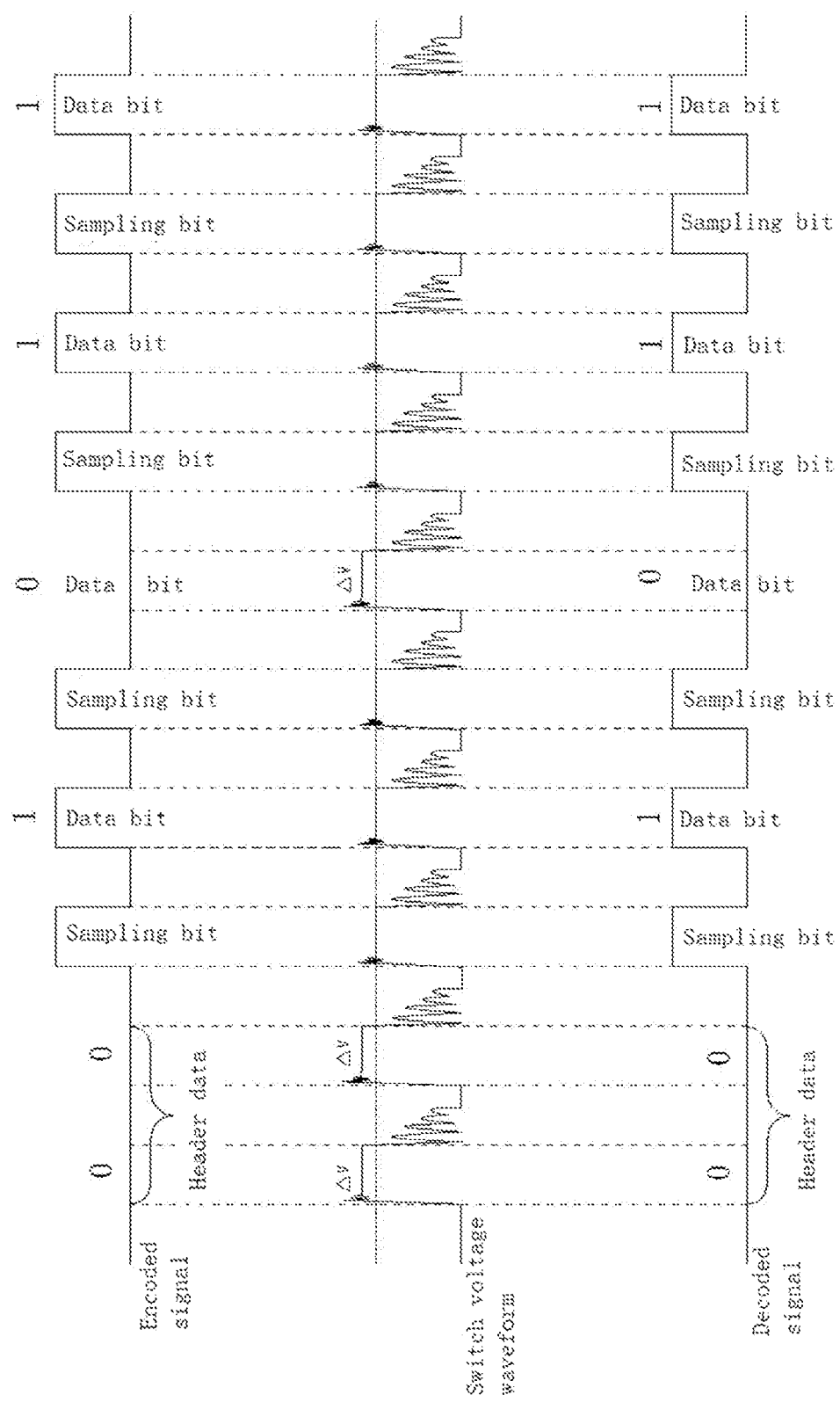
FIG. 5 is a schematic diagram of encoded signal, switch voltage waveform, and decoded signal of a switching power supply system in DCM mode according to a specific embodiment of the present application.

Referring to FIGS. 4 and 5, FIG. 4 shows the encoded signal, the switch voltage waveform, and the decoded signal of the switch power supply system operating in CCM mode. FIG. 5 shows the encoded signal, the switch voltage waveform, and the decoded signal of the switch power supply system operating in DCM mode. Although the switch voltage waveform in CCM mode is different from that in DCM mode, it does not affect the decoding result, that is, the decoding result in DCM mode is the same as that in CCM mode.

During the information transmission process, the encoding and controlling circuit 1 modulates the encoded signal onto the voltage waveform of the transformer secondary winding switch. Therefore, when transmitting "0" or "1" in the encoded signal, if the encoding and controlling circuit 1 does not turn on the synchronous rectification MOS transistor Q1 in a current cycle, it will cause a certain loss of system conversion efficiency during heavy loads and frequent data transmission. Therefore, in order to minimize the loss of system conversion efficiency as much as possible, the following methods can be adopted.

Figure 7:
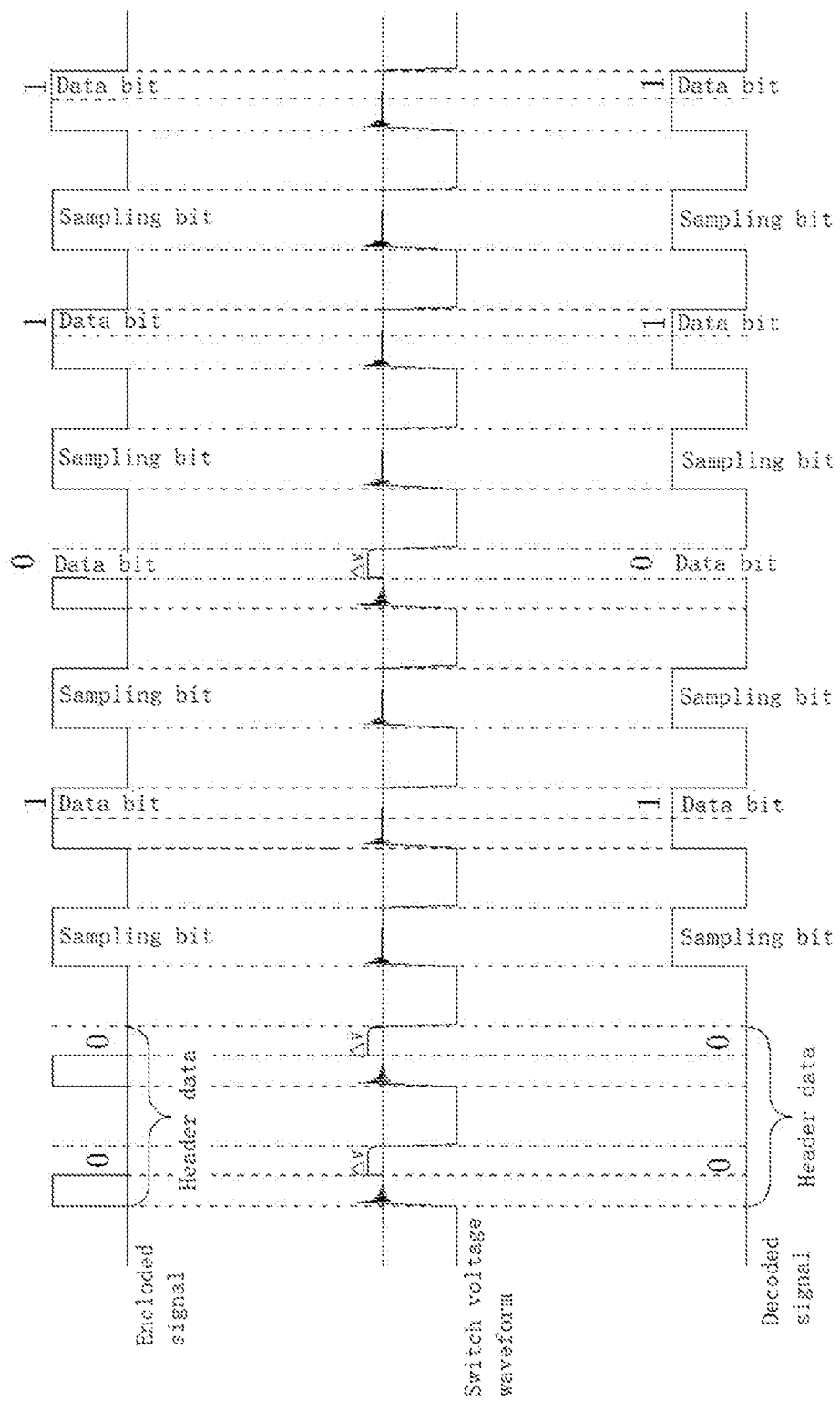
FIG. 7 shows a method for transmitting encoded signal in a switching power supply system in CCM mode according to a specific embodiment of the present application.

Referring to FIG. 7, the following is an example of a switching power supply system operating in CCM mode. The encoding and controlling circuit 1 transmits the header data and data bits in the encoded signal, whiling turning on the synchronous rectification MOS transistor Q1 to turn on during the first ½ cycles of the high level period of the secondary winding switch voltage waveform within one signal cycle (the current in the first half cycle is the maximum, and the loss due to absence of synchronous rectification is also the maximum) and turning off the synchronous rectification MOS transistor Q1 during the last ½ cycle of the high level period within the same signal cycle of the switch voltage waveform, and modulates one bit of the encoded signal data to one signal cycle of the secondary winding switch voltage waveform. Correspondingly, the decoding and controlling circuit 2 samples and decodes the voltage of the last ½ cycle of the high level period within one signal cycle of the modulated switching voltage waveform, to obtain the corresponding decoded signal.

Of course, it is also possible that, the encoding and controlling circuit 1 transmits the header data and the data bits in the encoded signal, while turning on synchronous rectification MOS transistor Q1 in the first ⅓ cycle of the high level period within one signal cycle of the secondary winding switch voltage waveform and turning off the synchronous rectification MOS transistor Q1 in the last ⅔ cycle of the high level period within one signal cycle of the secondary winding switch voltage waveform, and modulates one bit of the encoded signal data to one signal cycle of the secondary winding switch voltage waveform. Correspondingly, the decoding and controlling circuit 2 samples and decodes the voltage in the last ⅔ cycles during the high level period of the modulated switching voltage waveform within one signal cycle, to obtain the corresponding decoded signal. This will minimize the loss of system conversion efficiency as much as possible.

Likewise, the encoding and controlling circuit 1 can be set to turn on the synchronous rectification MOS transistor Q1 in the first 1/n cycle of the high level period within one signal cycle of the secondary winding switch voltage waveform, turn off the synchronous rectification MOS transistor Q1 in the last (n−1)/n cycle of the high level period within one signal cycle of the secondary winding switch voltage waveform, and modulate one bit of data of the encoded signal to one signal cycle of the secondary winding switch voltage waveform, and, correspondingly, decoding and controlling circuit 2 can be set to sample and decode the voltage in the last (n−1)/n cycle of the modulated switching voltage waveform during a high level period within a signal cycle, to obtain the corresponding decoded signal, where n is a natural number greater than 1. However, this way of transmitting information also increases the difficulty of control.

Of course, when the switching power supply system operates in DCM mode, this method of controlling the synchronous rectification MOS transistor Q1 to partially turn on and partially turn off during a high level period within a signal cycle of the switch voltage waveform can also be used to transmit information. This will not be repeated here.

The above are all preferred embodiments of the present application and do not limit the scope of protection of the present application. Therefore, any equivalent changes made based on the structure, shape, and principle of the present application should be covered within the scope of protection of the present application.

What is claimed is:

1. A switching power supply using a transformer for transmitting information, comprising:

an encoding and controlling circuit, configured for obtaining output information of a secondary side of the switching power supply and demand information of electrical equipment and generating an encoded signal according to the output information and the demand information, wherein the encoded signal comprises a data bit and a sampling bit; and the encoding and controlling circuit is configured for controlling on/off of a synchronous rectification metal-oxide semiconductor (MOS) transistor and modulating the encoded signal onto a switch voltage waveform of a transformer secondary winding by using the switch voltage waveform as a carrier;

a transformer auxiliary winding, configured to obtain a modulated switching voltage waveform of the transformer secondary winding by coupling; and a decoding and controlling circuit, configured for sampling and decoding the modulated switching voltage waveform, wherein the decoding and controlling circuit comprises a sampling module, a judging and decoding module, a digital-to-analog converter (DAC) module, and a loop control and drive module, wherein, the sampling module is configured to sample the modulated switching voltage waveform and generate a sampling signal;

the judging and decoding module is configured to decode the sampling signal to generate a decoded signal, output a digital signal corresponding to the data bit in the decoded signal to the DAC module, and output an analog feedback signal corresponding to the sampling bit in the decoded signal to the loop control and drive module;

the DAC module is configured to convert the digital signal corresponding to the data bit into an analog signal, and output the analog signal to the loop control and drive module;

the loop control and drive module is configured to control on/off time of a primary side switch based on the analog feedback signal corresponding to the sampling bit output by the judging and decoding module or the analog signal output by the DAC module, in order to adjust output information of the secondary side of the switching power supply and adapt the output information of the secondary side of the switching power supply to the demand information of the electrical equipment, and the loop control and drive module is configured to compare the analog feedback signal corresponding to the sampling bit output by the judging and decoding module with a preset reference value to obtain a difference between the analog feedback signal and the preset reference value, and control the on/off time of the primary side switch according to the difference between the analog feedback signal and the preset reference value to adjust the output information of the secondary side of the switching power supply; or the loop control and drive module is configured to update the preset reference value according to the analog signal output by the DAC module, and control the on/off time of the primary side switch according to an updated reference value to adjust the output information of the secondary side of the switching power supply.

2. The switching power supply according to claim 1, wherein:

the encoded signal comprises a header data or trigger bit;

when the header data or the trigger bit is not present in the decoded signal generated by the judging and decoding module, the judging and decoding module does not output the digital signal corresponding to the data bit and the analog feedback signal corresponding to the sampling bit; and when the header data or the trigger bit is present in the decoded signal generated by the judging and decoding module, the judging and decoding module outputs the digital signal corresponding to the data bit and the analog feedback signal corresponding to the sampling bit from one or more bits behind the header data or the trigger bit.

3. The switching power supply according to claim 2, wherein the data bit and sampling bit of the encoded signal are alternately arranged, one or more data bits are arranged between adjacent sampling bits, and one or more sampling bits are arranged between adjacent data bits.

4. The switching power supply according to claim 3, wherein a number of bits of the header data is at least 1 bit more than a number of data bits between the adjacent sampling bits.

5. The switching power supply according to claim 1, wherein the encoding and controlling circuit is further configured to control the on/off of the synchronous rectification MOS transistor and modulates the encoded signal onto the switch voltage waveform of the transformer secondary winding by using the switch voltage waveform as the carrier, wherein the encoding and controlling circuit modulates one or more bits of the encoded signal to one signal cycle of a transformer secondary winding switch voltage waveform or modulates one bit of the encoded signal to two or more signal cycles of the transformer secondary winding switch voltage waveform.

6. The switching power supply according to claim 5, wherein the encoding and controlling circuit modulating the one or more bits of the encoded signal to the one signal cycle of the transformer secondary winding switch voltage waveform comprises:

the encoding and controlling circuit turning on the synchronous rectification MOS transistor in a first 1/n cycle of a high level period within the one signal cycle of the transformer secondary winding switch voltage waveform, turning off the synchronous rectification MOS transistor in a last (n−1)/n cycle of the high level period within the one signal cycle of the transformer secondary winding switch voltage waveform, and modulating one bit of the encoded signal to the one signal cycle of the transformer secondary winding switch voltage waveform, or, the encoding and controlling circuit turning off the synchronous rectification MOS transistor in the first 1/n cycle of the high level period within the one signal cycle of the transformer secondary winding switch voltage waveform, turning on the synchronous rectification MOS transistor in the last (n−1)/n cycle of the high level period within the one signal cycle of the transformer secondary winding switch voltage waveform, and modulating one bit of the encoded signal to the one signal cycle of the transformer secondary winding switch voltage waveform, where n is a natural number greater than 1.

7. The switching power supply according to claim 1, wherein the encoding and controlling circuit comprises a discharge module configured to increase a frequency of the switch voltage waveform when the frequency of the switch voltage waveform is low due to light or no-load operation of the switching power supply.

8. The switching power supply according to claim 7, wherein the discharge module is a controllable load.

9. The switching power supply according to claim 1, wherein the output information of the secondary side comprises one or more selected from a group consisting of an output voltage, an output current, an output power, and an output line loss compensation information; and the demand information of the electrical equipment comprises one or more selected from a group consisting of a demand voltage, a demand current, a demand power, and a demand line loss compensation information.

* * * * *